(12) United States Patent  
Miyazaki

(10) Patent No.: US 8,148,700 B2  
(45) Date of Patent: Apr. 3, 2012

(54) SPECIMAN HOLDER AND SPECIMAN HOLDER MOVEMENT DEVICE

(75) Inventor: Hiroya Miyazaki, Umi-machi (JP)

(73) Assignee: Hiroya Miyazaka, Umi-machi (JP)

( * ) Notice: Subject to any disclaimer, the term of this patent is extended or adjusted under 35 U.S.C. 154(b) by 271 days.

(21) Appl. No.: 12/491,363

(22) Filed: Jun. 25, 2009

(65) Prior Publication Data

US 2010/0006771 A1  Jan. 14, 2010

(30) Foreign Application Priority Data

Jul. 8, 2008  (JP) ................................ 2008-201226
Jan. 30, 2009  (JP) ................................ 2009-019548

(51) Int. Cl.
*H01J 37/20* (2006.01)
(52) U.S. Cl. ................................................. 250/442.11
(58) Field of Classification Search .............. 250/442.11
See application file for complete search history.

(56) References Cited

U.S. PATENT DOCUMENTS 5,744,800 A * 4/1998 Kakibayashi et al. ... 250/442.11

FOREIGN PATENT DOCUMENTS

JP   2007-179805   7/2007

* cited by examiner

*Primary Examiner* — Jack Berman
(74) *Attorney, Agent, or Firm* — AdvantEdge Law Group, LLC

(57) ABSTRACT

It is an object of the present invention to provide a significantly beneficial specimen holder which allows mounting one or more specimens, for example, a specimen to be examined and a standard adjustment specimen for aberration correction in one specimen holder at the same time, thereby observing each specimens. The present invention is a specimen holder having a specimen holder movement mechanism for driving the specimen holder, wherein the specimen holder movement mechanism makes it possible to move the specimen holder approximately along the longer side of the specimen holder. In a preferred embodiment of the specimen holder according to the present invention, the specimen holder is characterized in that the specimen holder movement mechanism makes it possible to vary an insertion depth of the specimen holder into a tube for holding the specimen holder, with no relation to another specimen holder movement mechanism set for driving the specimen holder approximately along the longer side of the specimen holder.

10 Claims, 2 Drawing Sheets

SPECIMAN HOLDER AND SPECIMAN HOLDER MOVEMENT DEVICE

FIELD OF THE INVENTION

The present invention relates to a specimen holder, in particular, a specimen holder having a specimen holder movement mechanism for driving the specimen holder. Furthermore, the present invention relates to a specimen holder movement device.

BACKGROUND

When specimens are observed with use of Transmission Electron Microscopes (Hereinafter referred to as TEM) or Scanning Transmission Electron Microscopes (Hereinafter referred to as STEM) the specimen holder is located inside the TEM or STEM. The holder is inserted into a goniometer stage (A goniometer stage is a device that may move in 4 directions allowing individual specimens to be observed in different positions, tilt angles and height) and selection between specimens may be done during observation at the position of the electron beam optical axis.

The detailed explanation follows here. Regarding the goniometer stage FIG. 1 is the mechanical drawing referred to hereinafter. The shadow area shows cross-sectional surface. The area of observation is limited, and the specimen holder (3) together with the specimen (1) is kept in place by item (8) of the goniometer stage. The location of the specimen itself (1) is at the center of the point of electron beam optical axis (center of 13, 14) inside the electron microscope column (15). For observation of various positions of a specimen (1) at the position of the optical axis (center of 13, 14) it is possible to move the specimen holder (3) along the two horizontal axes (13, 14). The items (21, 22, 23) allow the specimen holder (3) together with the specimen (1) to be moved along the horizontal axis (14) hereinafter referred to as X-axis direction. The items (18, 19, 20) allow the specimen holder (3) together with the specimen (1) to be moved along the horizontal axis (13) hereinafter referred to as Y-axis direction. It is also possible to move the specimen holder (3) together with the specimen. (1) in the vertical direction along the optical axis (center of 13, 14), hereinafter referred to as Z-axis direction. Furthermore it is possible to tilt the specimen holder (3) together with the specimen (1) to create an inclination, hereinafter referred to as Alpha angle, of the specimen (1) around the X-axis direction. This is achieved by rotating the complete goniometer stage.

Regarding the specimen holder (3), hereinafter the directions of it are hereby defined and referred to as front-end and rear-end. The front-end is defined as the position of the tip of the specimen holder near the electron beam optical axis (center of 13, 14). Rear-end is defined as the position of the handle (5) of the specimen holder (3).

Inserting a specimen holder (3) or similar into the TEM or STEM ultrahigh-vacuum pumped column area (12) requires pumping vacuum of the area around the specimen holder (3) itself. This is performed with a so-called airlock valve system. The airlock pumps vacuum around the area from front-end of specimen holder (3) until the location of the vacuum seal (16). After airlock pumping, the pumped area may be pressure-wise connected to the ultrahigh-vacuum pumped column area (12) by opening the airlock. The airlock pumping procedure usually takes from 1 to 3 minutes. Each time the airlock pumping procedure is performed the ultrahigh-vacuum pumped column area (12) vacuum level will deteriorate. Therefore it is not possible to sequentially retract and insert the holder during a short period of time.

The vacuum level inside the ultrahigh-vacuum pumped column area (12) will deteriorate each time a specimen (1) is replaced. The deterioration of the ultrahigh-vacuum pumped column area will cause contamination of specimens during observation with the electron beam. Hence it is an advantage to be able to fit several specimens to one single specimen holder (3) to reduce the number of specimen replacements.

The detailed explanation of the airlock valve system mentioned above is omitted since it is not an essential part of the invention itself. The location of the airlock valve system is the item number 4 of mechanical FIG. 1.

Existing technology allows several specimens to be mounted in one specimen holder. In such type of holders the specimens are mounted in a row and may slide along the X-axis direction (14). They also allow switching between specimens during observation with the TEM or STEM. Specimen holders that allow tilt of the specimen (1) to create an inclination, hereinafter referred to as Beta angle, of the specimen (1) around the Y-axis direction (13) also exist. A specimen holder allowing several specimens to be mounted and allowing inclination of the Beta angle is not known.

Existing technology allows several specimens to be loaded into one specimen holder before observation. The specimens are mounted along the X-axis direction (14) and may slide between specimens during observation. Further on, specimen holders that allow tilt of the Beta angle, which is inclination around the Y-axis direction (13), are currently available. However, specimen holders that allow the above described Beta tilt combined with technology allowing several specimens to be loaded in one specimen holder are currently not available.

The detailed explanation follows here. Regarding the TEM or STEM it uses a strong and highly stable magnetic field lens to achieve the desired function of the electron microscope optical system. The purpose is to achieve best possible resolution images without disturbance from mechanical vibration or disturbing the stability of the magnetic field; the specimen holder itself is here a critical part of the achievable resolution performance. Designing a specimen holder demands consideration of mechanical strength to avoid vibrations. It is also necessary to design a specimen holder with non-magnetic materials to avoid disturbance of the highly stable magnetic field in the magnetic lens. Further on the physical space is very limited. The front-end of the specimen holder is typically designed with a diameter of 6 mm and maximum allowed diameter is around 10 mm. However designing a specimen holder with a large diameter will limit the achievable movement, especially Alpha tilt inclination and Beta tilt inclination. Considering all the difficulties of the above it insinuates why until now a specimen holder able to perform Beta tilt combined with loading several specimens into one specimen holder is not currently available. It is very difficult to design a specimen holder that allows the described desired function without loosing performance.

In recent years, use of an aberration correction device (known as Cs Corrector) has increased. The Cs corrector is a device for correction of spherical aberration caused in a convex magnetic lens typically used in a TEM or STEM. The use of Cs corrector devices has improved the performance of TEM or STEM significantly. In some cases two Cs correctors may be included in one microscope. A thin film amorphous specimen (standard adjustment specimen) is used for adjusting the Cs corrector to optimum performance. A case of a too thick or a non-suitable specimen will not allow adjustment of this Cs corrector to the optimum level of performance. It is preferred to always have easy access to a suitable specimen for adjustment of the Cs corrector.

The detailed explanation follows here. Regarding adjustment of the aberration correction device, until now the procedure has been as follows. A thin film amorphous specimen (standard adjustment specimen) is inserted into the goniometer stage of the TEM or STEM. At this point in time adjustment of the Cs corrector device may be performed. After this adjustment is completed, the specimen holder is removed from the TEM or STEM. The specimen actually desired for observation is now placed in to the holder and next into the TEM or STEM, in some cases using another specimen holder. This operation takes time and cause deterioration of the vacuum level as described above.

In addition, the room temperature being different from the temperature inside the microscope column (12) influences the material of the specimen holder, causing an expansion or contraction of the same. It is further affected by the mechanical stress caused in the above-mentioned airlock (4) pumping procedure. This result in drift of the specimen (1) and it may last for a considerable time causing difficulties to achieve optimum resolution performance. The delay may vary due to temperature conditions but cases of half an hour or more of stabilization wait time can be considered common.

There are cases of observing specimens that needs to be orientated with use of Alpha inclination and Beta inclination. When observing crystalline specimens it is necessary to position the crystallographic orientation of the specimen itself along the electron beam optical axis. This is achieved by tilting the specimen holder (3) together with the specimen (1) to create an inclination of the specimen (1) around the X-axis direction and tilting the specimen holder (3) together with the specimen (1) to create an inclination of the specimen (1) around the Y-axis. After this crystallographic orientation has been adjusted it would be optimum to be able to switch to a thin film amorphous specimen (standard adjustment specimen) suitable for electron optics adjustments. A specimen holder covering these functions has not yet been available.

Therefore, it is an object of the present invention to provide a significantly beneficial specimen holder which allows mounting one or more specimens, for example, a specimen to be examined and a standard adjustment specimen for aberration correction in one specimen holder at the same time, thereby observing each specimens.

SUMMARY

To be able to solve the above-mentioned problems, the inventor discovered the present invention as a result of extensive examination of suitable parts, suitable design and construction methods for a specimen holder movement device.

That is, the present invention is a specimen holder having a specimen holder movement mechanism for driving the specimen holder, wherein the specimen holder movement mechanism makes it possible to move the specimen holder approximately along the longer side of the specimen holder. It is a specimen holder including a specimen movement device enabling selection between several specimens. It is preferred to be able to slide between specimens in the direction, as described above, along the longer side of the specimen holder axis previously described as X-axis direction.

Furthermore, in a preferred embodiment of the specimen holder according to the present invention, the specimen holder is characterized in that the specimen holder movement mechanism makes it possible to vary an insertion depth of the specimen holder into a tube for holding the specimen holder, with no relation to another specimen holder movement mechanism set for driving the specimen holder approximately along the longer side of the specimen holder.

Furthermore, in a preferred embodiment of the specimen holder according to the present invention, the specimen holder is characterized in that the specimen holder movement mechanism is able to perform high precision control of the specimen location along the longer side of the specimen holder. This movement mechanism allows very fine control of the movement.

Furthermore, in a preferred embodiment of the specimen holder according to the present invention, the specimen holder is characterized in that the specimen holder movement mechanism is an actuator or a micrometer capable of linear driving.

Furthermore, in a preferred embodiment of the specimen holder according to the present invention, the specimen holder is characterized in that the specimen holder movement mechanism has a piezoelectric element. This movement may need extremely fine and linear control of the position with use of a piezoelectric element.

Furthermore, in a preferred embodiment of the specimen holder according to the present invention, the specimen holder is characterized in that the specimen holder has one or more locations for mounting a specimen which is able to be observed by the specimen holder movement mechanism. This movement mechanism makes it possible to slide the specimen holder in order to select between two or more specimens, made available for observation.

Furthermore, in a preferred embodiment of the specimen holder according to the present invention, the specimen holder is characterized in that the specimen holder movement mechanism makes it possible to retract the specimen holder a controlled distance in the direction approximately along the longer side of the specimen holder, thereby arranging additional locations for mounting a specimen so that a specimen may be observed. According to the movement mechanism, the specimen holder is able to move the distance to be able to select between the specimens mounted, as it is needed for the application.

Furthermore, a specimen holder movement device according to the present invention is characterized by a specimen holder movement device comprising: a primary specimen holder movement mechanism for driving the specimen holder approximately along the longer side of the specimen holder, a secondary specimen holder movement mechanism for driving the specimen holder approximately along the longer side of the specimen holder with no relation to the primary specimen holder movement mechanism. According to this movement device, the specimen holder is able to slide for selection between specimens without affecting the performance or disturbing the main X-direction movement of the microscope itself.

Furthermore, in a preferred embodiment of the specimen holder movement device according to the present invention, the specimen holder movement device is characterized in that an arrangement constitution of the secondary specimen holder movement mechanism does not depend on a gonio stage and a main body of the specimen holder, or is able to be arranged to any one of a gonio stage or a main body of the specimen holder. According to this movement device, the specimen holder is able to slide for selection between specimens and is independent from the X-direction movement device of the microscope goniometer stage. The movement device of the present invention is able to operate without affecting the performance or disturbing the main X-direction movement of the microscope goniometer stage.

Furthermore, in a preferred embodiment of the specimen holder movement device according to the present invention, the specimen holder movement device is characterized in that a secondary specimen holder movement mechanism is mounted to the specimen holder. This movement device can be embodied in the specimen holder itself.

Furthermore, in a preferred embodiment of the specimen holder movement device according to the present invention, the specimen holder movement device is characterized in that a secondary specimen holder movement mechanism is mounted to a handle portion of the specimen holder. The above described movement device drive mechanism can be embodied in the specimen holder handle part. The specimen holder handle part is item (5) in FIG. 1 of the mechanical drawing.

Furthermore, in a preferred embodiment of the specimen holder movement device according to the present invention, the specimen holder movement device is characterized in that a secondary specimen holder movement mechanism has an actuator capable of linear driving, or a piezoelectric element.

Furthermore, in a preferred embodiment of the specimen holder movement device according to the present invention, the specimen holder movement device is characterized in that the actuator capable of linear driving and/or a piezoelectric element may be remotely controlled. An actuator or a piezoelectric element are for the purpose of linear and very fine movement control. The control of the actuator or the piezoelectric element may be done remotely through cables connected to the specimen holder.

Furthermore, in a preferred embodiment of the specimen holder movement device and specimen holder according to the present invention, the specimen holder movement device is characterized in that the specimen holder movement device comprise: a main body of the specimen holder, the locations for mounting a specimen which is able to be observed, that are located in the direction approximately along the longer side of the main body of the specimen holder, and a specimen holder movement mechanism making it possible to switch the locations to a predetermined location, wherein the specimen holder movement device makes it possible to retract both the goniometer stage and the specimen holder a controlled distance in the direction approximately along the longer side of the specimen holder with no relationship to the driving mechanism mounted to the goniometer stage making it possible to move the holder approximately along the longer side of the specimen holder.

Furthermore, in a preferred embodiment of the specimen holder movement device and the specimen holder according to the present invention, the specimen holder movement mechanism is characterized in that the specimen holder movement mechanism has a mechanical construction which does not obstruct the movement controlled by a tilting device allowing Beta angle inclination since the specimen holder movement mechanism makes it possible to move the specimen holder axis itself and renders no restriction of the existing techniques mounted to the retentive portion of the specimen holder. The X-direction movement device and the tilting device are mechanically and electrically separated from each other. The individual movement of one does not obstruct the movement of the other.

Furthermore, in a preferred embodiment of the specimen holder movement device and the specimen holder according to the present invention, the specimen holder movement mechanism is characterized in that the specimen holder movement mechanism makes it possible to move the specimen holder to a predetermined distance in a direction approximately along the longer side of the specimen holder, such as toward the back direction of the holder by only a movement force of the specimen holder. That is, the sliding mechanism operates back and forth inside the specimen holder handle (5). In the direction to the front-end of the specimen holder the movement force is caused by the pressure difference from outside (air pressure) and inside the microscope column (vacuum). To clarify, the movement of the sliding mechanism towards the center of the microscope column is only caused by the force of pressure difference.

Furthermore, in a preferred embodiment of the specimen holder movement device and the specimen holder according to the present invention, the specimen holder movement mechanism is characterized in that to be able to shift the position of the specimens without disturbing or interfering with the movement of the microscope goniometer stage, the specimen holder position is able to move to vary the shaft length in order to render the microscope goniometer stage and the specimen holder the above-mentioned action movement force capable of moving it in a predetermined distance approximately along the longer side of the specimen holder.

Furthermore, in a preferred embodiment of the specimen holder movement device and the specimen holder according to the present invention, the specimen holder movement mechanism is characterized in that to be able to shift the position of the specimens without disturbing or interfering with the movement of the microscope goniometer stage, the specimen holder position is able to move to vary the width length in order to render the microscope goniometer stage and the specimen holder the above-mentioned action movement force capable of moving it in a predetermined distance approximately along the longer side of the specimen holder.

Furthermore, in a preferred embodiment of the specimen holder movement device and the specimen holder according to the present invention, the specimen holder movement mechanism is characterized in that to be able to shift the position of the specimens without disturbing or interfering with the movement of the microscope goniometer stage, the movement can be controlled and maintained by a piston mechanism (This piston mechanism is hereinafter referred to as the linear actuator.) in order to render the microscope goniometer stage and the specimen holder the above-mentioned action movement force capable of moving it in a predetermined distance approximately along the longer side of the specimen holder. The pressure force, explained above, pulls the holder towards the center of the microscope column. In the other direction, pushing the specimen holder away from the center of the microscope column, the movement can be controlled and maintained by a piston mechanism.

Furthermore, in a preferred embodiment of the specimen holder movement device and the specimen holder according to the present invention, the specimen holder movement mechanism is characterized in that the shape of the movement mechanism has been designed to utilize the very limited space between the Specimen holder handle portion (5) and the space available near the specimen holder entrance hole inside item (9).

Furthermore, in a preferred embodiment of the specimen holder movement device and the specimen holder according to the present invention, the specimen holder movement mechanism is characterized in that the movement mechanism is mechanically connected with the handle of the specimen holder.

Furthermore, in a preferred embodiment of the specimen holder movement device and the specimen holder according to the present invention, the specimen holder movement mechanism is characterized in that the specimen holder is designed to fit in a standard microscope goniometer stage without modifications of it even though it includes the above mentioned movement device.

Furthermore, in a preferred embodiment of the specimen holder movement device and the specimen holder according to the present invention, the specimen holder movement mechanism is characterized in that the movement mechanism is possible to detach from the specimen holder itself and the specimen holder may still be functional for single specimen use.

Furthermore, in a preferred embodiment of the specimen holder movement device and the specimen holder according to the present invention, the specimen holder movement mechanism is characterized in that the specimen holder may get its force to slide from one movement device or several movement devices.

Furthermore, in a preferred embodiment of the specimen holder movement device and the specimen holder according to the present invention, the specimen holder movement mechanism is characterized in that the specimen holder may contain specimen-mounting positions for one or more specimens. The tip of the movement device near the front-end of the specimen holder may contain specimen-mounting positions for one or more specimens.

The methods to solve above mentioned problems are further described here. Regarding the following explanation of the present invention, FIG. 2 is the mechanical drawing referred to hereinafter. The shadow area shows cross-sectional surface. The specimen holder (3) is drawn towards the center of the microscope column (15) by the force of pressure difference, that is, by using a negative-pressure of the vacuum pumped area of the microscope column (12). The negative pressure in the area (12) does force the specimen holder (3) to move towards the center of the microscope column (15). A linear actuator (6) is arranged in the handle portion (5) of the specimen holder (3). The pin for driving (7) of a linear actuator (6) moves in and moves out, controlling the size of space between the specimen holder handle portion (5) and the specimen holder entrance hole inside item (9). The pin for driving (7) of a linear actuator (6) moves in and moves out making it possible to control the position (e.g. the length of the holder as recognized by the microscope goniometer stage movement device). The position of the specimen holder inserted up to the position (10) for holding the specimen holder of the microscope goniometer stage will be varied by the movement of the pin. The specimen holder movement mechanism (6, 7) is able to control the position of the specimen holder itself by the tip of the pin (7), which is then connected to the linear actuator. This may be done without disturbing the control made by the microscope goniometer stage.

Moreover, the mechanism existing the main body of the goniometer stage for controlling the specimen holder (3) approximately along the longer side of the specimen holder will be described as follows. The specimen holder (3) is installed into the tube (8) for holding the specimen holder attached into the goniometer stage frame (11) and drawn towards the center of the microscope column (11) by using a negative-pressure of the vacuum pumped area (12) of the microscope column. The specimen holder (3) is contacted at a working point (10) through a link member (23) by means of the driving shaft 22 of the linear actuator 21 fixed to the tube (8) for holding the specimen holder. The movement of the driving shaft is transmitted to a working point (10) via a link member (23). Pushing and pulling a pin of a link member (23) at a working point in a direction along the longer side of the specimen holder makes it possible to drive the specimen holder (3) back and forth approximately along the longer side of the specimen holder (that is, a direction of X-axis 14), and thereby driving the position of a specimen mounted to a specimen mounting location (1). Fortunately the direction of the specimen holder axis where multiple specimens are preferred to be located is the direction possible to control by the X-movement device of the microscope goniometer stage, as well as the direction possible to be controlled by the linear actuator inside the specimen holder handle (5). The microscope goniometer stage works on the principle using the force caused by pressure difference and is controlled by the positioning system that consists of items 21, 22 and 23 interacting with the items 8, 9 and 10. The invention is extending this movement without disturbing the same by creating a second positioning system that consists of items 6 and 7 interacting with the items 8, 9 and 10. The direction of all the described movements is along the axis (14) referred to as the X-direction. The construction allows switching between specimens mounted in position 1 or position 2. It may also control more specimens than two if needed. The position in the X-direction maintained by the microscope goniometer stage is connected together with item (8, 9) and is controlled by the lever (23) pushing at the position (10).

The present invention allows specimen movement by retracting the specimen holder itself and this may be done without interfering with the X-direction movement control built in the microscope goniometer stage. As a result, the specimen holder movement mechanism of the present invention makes it possible to move a specimen in order to be observed, and thereby creating a new specimen mounting location (2) built in a top of the main body of the specimen holder, in addition to the specimen mounting location (1) capable of being observed by using the X-direction movement mechanism built in the microscope goniometer stage. The movement in the X-direction as well as the Y-direction may be performed as with any existing specimen holder for both positions 1 and 2 of this specimen holder. The movement in the Z-direction as well as the Alpha angle inclination may be performed as with any existing specimen holder for both positions 1 and 2 of this specimen holder. The invention also allows Beta angle inclination, which is built into the same.

The specimen holder movement mechanism of the present invention makes it possible to allow mounting of specimens in the indicated specimen mounting location (1) for observing a specimen and specimen mounting location (2) for observing a standard adjustment sample for the aberration correction, and also to allow switching both positions to a desired position. For example a specimen desired for actual observation that requires Beta angle inclination may be mounted in position 1. Then the specimen desired for adjustment of an aberration corrector system may be mounted in position 2. That is, the invention has an advantage effect that it is possible to mount a standard specimen desired for adjustment of an aberration corrector system at the same time, in addition to a specimen desired for actual observation.

Furthermore, the invention holder movement mechanism according to the present invention has an advantage effect that it is possible to observe a specimen desired for actual observation immediately after the aberration correction is carried out by using a standard adjustment specimen for the aberration correction, since in the case that the present invention is incorporated into a new electron microscope, such as TEM, STEM with the aberration correction device, it is possible to mount a standard specimen desired for adjustment of an aberration corrector system at the same time that a specimen desired for actual observation is mounted. That is, the specimen holder of the present inventions can be inserted into the TEM or STEM. After this operation is complete, both adjustment of the aberration corrector device and observation of a specimen that requires Beta angle inclination may be done without removing the specimen holder from the microscope goniometer stage.

Moreover, in the specimen holder movement mechanism, it also contains a mechanism for Beta angle inclination. However, a different construction of the Beta angle inclination would also allow the present invention to be implemented. It would also be possible to implement this invention to other specimen holders for various purposes, such as a specimen rotation holder.

The following refers to the mechanical drawing, FIG. 2. Between the specimen holder handle portion (5) and the area around the hole for inserting the specimen holder (8, 9) there is a gap. It is possible to control the distance of this gap by moving the pin (7) in or out, the pin (7) is then connected to linear actuator (6). This may be done without disturbing the control of the X-direction movement device (21, 22, 23) of the microscope goniometer stage function. It is possible to fully observe the area of and select between specimen 1 and specimen 2 just by moving the specimen holder with the linear actuator.

BRIEF DESCRIPTION OF THE DRAWINGS

The mechanical drawing describing existing technology concerning the body tube of the electron microscope and the microscope goniometer stage is drawn as FIG. 1.

The mechanical drawing describing existing technology combined with the new technology included in the present invention as an example is drawn as FIG. 2.

Figure 1:
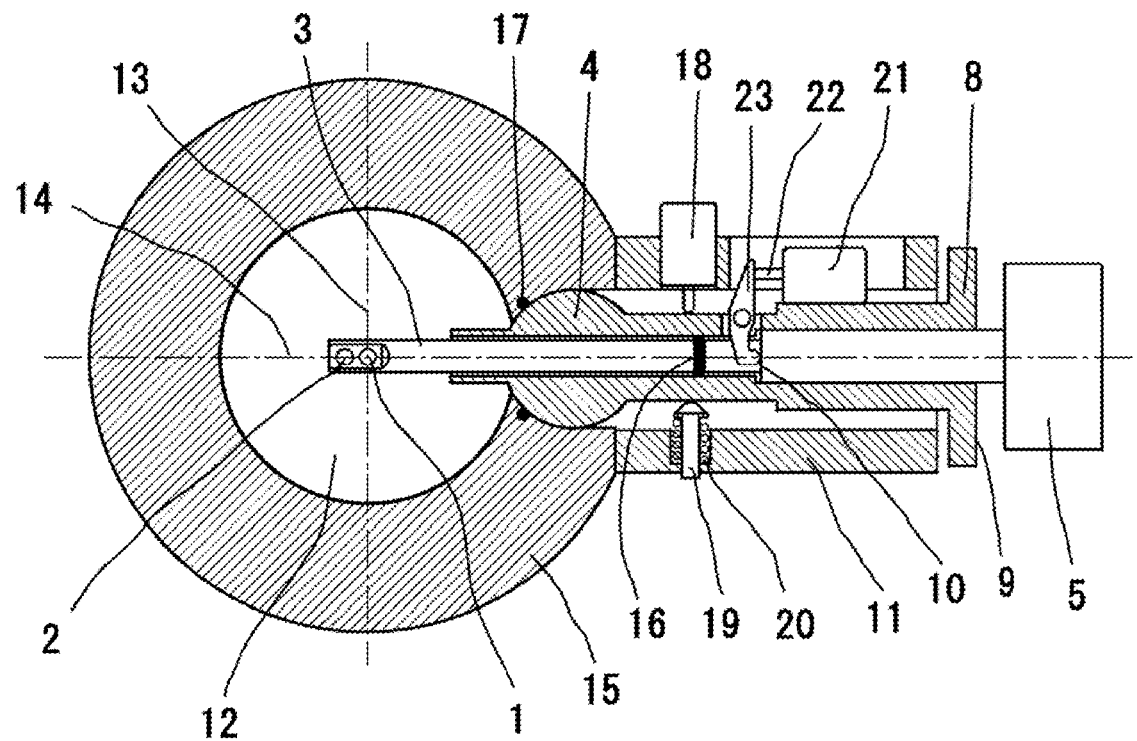

Reference numbers in the drawings:
1—Specimen mounting location that may be observed with the X-axis control of the microscope goniometer stage.
2—Additional specimen mounting location that may be observed with aid of the present invention.
3—Specimen holder axis portion.
4—Specimen holder support and vacuum airlock valve system. An area around a driving point for driving a specimen location located with a tube for holding the specimen holder.
5—Specimen holder handle portion.
6—Linear actuator and secondary movement mechanism (device) for driving the specimen holder.
7—Pin that moves by force of linear actuator (6).
8—A tube for holding the specimen holder. (The specimen holder fits in the tube.)
9—Specimen holder entrance and support.
10—Goniometer stage X-direction control lever (23) applies its force to the specimen holder on this surface.
11—Goniometer stage frame (indicated as cylindrical shape).
12—Vacuum pumped area existing in the microscope column.
13—Y-direction movement direction. Beta angle inclination is around this line. This line cross at right angles with item 14.
14—X-direction movement direction. Alpha angle inclination is around this line. The X-axis is in a direction approximately along the long side of the specimen holder.
15—Electron microscope column.
16—O-ring on specimen holder for isolation of vacuum between outside and area (12).
17—O-ring on goniometer stage airlock for isolation of vacuum between outside and area (12).
18—Linear actuator for Y-axis drive of specimen holder.
19—Y-axis pushback mechanism pin.
20—Y-axis pushback mechanism spring to create a force for item 19
21—Linear actuator for X-axis drive of specimen holder.
22—X-axis mechanism pushing pin.
23—A link member for using a drive transmission in a direction of X-axis

DESCRIPTION OF PREFERRED EMBODIMENTS

The present invention is a specimen holder having a specimen holder movement mechanism for driving the specimen holder, wherein the specimen holder movement mechanism makes it possible to drive the specimen holder approximately along the longer side of the specimen holder. The specimen holder includes a selection device to allow selection between two or more specimens. In general, it is possible to drive a specimen holder along the longer side of the specimen holder with use of the X-axis movement control (21, 22 and 23 of FIG. 1) built in the microscope goniometer stage device, thereby controlling the specimen mounting position (1) fitted up to the specimen holder (3). In the present invention, it is possible to control the X-axis movement more sensitively with use of another mechanism other than such as the existing X-axis movement mechanism according to the microscope goniometer stage device. The present invention makes it possible to move and control the holder in a direction of X-axis, without disturbing the control of the existing X-direction movement mechanism. That is, use of the additional control of the X-axis direction of this invention is made available completely separated from the movement control of the goniometer stage. Using the movement control of this invention does not interfere or disturb with the movement control of the goniometer stage including movements in the X-direction, Y-direction, Z-direction or Alpha angle inclination. Using this invention will not disturb or reduce performance of the observation made with the TEM or STEM. At the moment, the term "approximately along the longer side of the specimen holder." used herein means that the term includes embodiments wherein a direction of the longer side of the specimen holder is somewhat tilted as compared with the X-axis. The term "gonio stage' used herein generally means such devices capable of driving the specimen mounting position attached to the specimen holder in directions of X, Y, and Z-axis for the optical axis of the electron beam, and also performing the tilting rotary of a specimen around the X-axis. Moreover, it is known in a manufacturer, a user and an academic conference of the electron microscope that the gonio meter means that a device having a mechanism capable of rotating the objects for a point located on a central axis of the stage. In the scanning electron microscope, it is known that it is so called "be equipped with a gonio meter mechanism type of the specimen movement device" to represent it a high performance device having an added-value. The gonio stage in the present invention also includes a gonio meter type of stage in a broad sense. TEM or STEM manufacturers, TEM or STEM users or other members of the electron microscopy society, may also apply the present invention for such type of specimen holders or other type of specimen holders that may be invented in the future.

Furthermore, in a preferred embodiment of the specimen holder according to the present invention, the specimen holder is characterized in that the specimen holder movement mechanism makes it possible to vary an insertion depth of the specimen holder into a tube for holding the specimen holder, with no relation to another specimen holder movement mechanism for driving the specimen holder approximately along the longer side of the specimen holder. As the "another specimen holder movement mechanism for driving the specimen holder approximately along the longer side of the specimen holder" mention may be made of a movement mechanism made by an actuator 21, 22, 23 etc., of FIGS. 1 or 2. A specimen may be mounted in position 1 or position 2 and after insertion of the holder inside the microscope goniometer stage; selection of either specimen may be performed. After selection of specimen, control of the position may be done and movement of it in any direction, with use of the microscope goniometer stage built in movement control (for X-direction 21, 22 and 23 of FIG. 2), may be performed as with any existing specimen holder. The position-measuring device of the microscope goniometer stage may be used as usual in the directions X, Y, Z and Alpha angle inclination. The movement mechanism of the present invention may be installed to the existing device, may control the holder no relation with any existing device. Off course, the function of the existing device is not disturbed by the mechanism of the present invention, if the present invention is installed into the existing device.

Furthermore, in a preferred embodiment of the specimen holder according to the present invention, the specimen holder is characterized in that the specimen holder movement mechanism is able to perform high precision control of the specimen location along the longer side of the specimen holder. This movement mechanism allows very fine control of the movement. The control of the X-direction position with use of the present invention may be performed with the high precision desired.

Furthermore, in a preferred embodiment of the specimen holder according to the present invention, the specimen holder is characterized in that the specimen holder movement mechanism is an actuator or a micrometer capable of linear driving. The control of the X-direction position with use of this invention and its included actuator or micrometer may be performed with the linearity desired.

The actuator recommended being used for the invention depend on the application, but may have a linear movement range of tens of millimeters. The precision, meaning the limit of minimum movement control, of the actuator is generally estimated to be around 0.01 millimeter. On the other hand, the precision, meaning the limit of minimum movement control, of the piezoelectric element can be estimated to be around few nanometers. However, an operation range of piezoelectric element is a micrometer level. Therefore, the preferred movement device for this movement device may consist of a combination of an actuator, or similar, together with a piezoelectric element to obtain a merit both an operation range and a minimum control capability. As mentioned above, an appropriate combination may produce a specimen holder or a specimen holder movement device having a predetermined ability.

Furthermore, in a preferred embodiment of the specimen holder according to the present invention, the specimen holder is characterized in that the specimen holder movement mechanism has a piezoelectric element. It may use a piezoelectric element for extremely fine control of this movement device. A piezoelectric element is made of a material that expands or retracts depending on the electric energy fed to the same.

Figure 2:
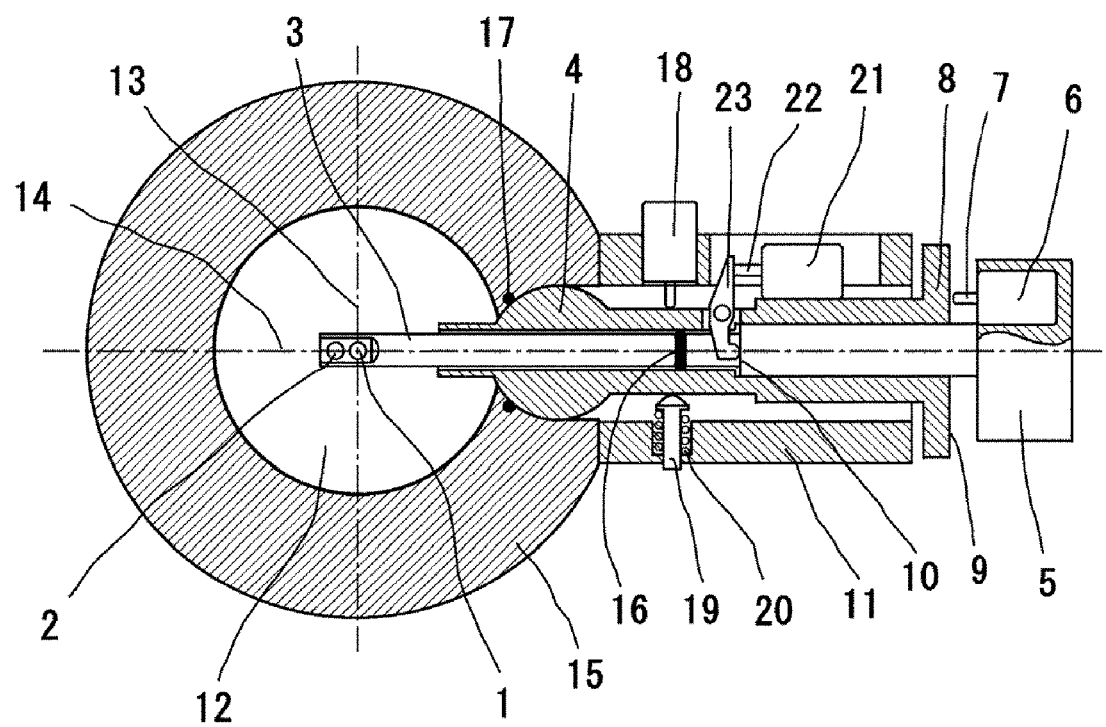

Furthermore, in a preferred embodiment of the specimen holder according to the present invention, the specimen holder is characterized in that the specimen holder has two or more locations for mounting a specimen which is able to be observed by the specimen holder movement mechanism. The movement mechanism of the present invention can be installed no relation to the existing movement mechanism, and thereby making it possible to expand an area for observing a specimen drastically. A specimen mounting position can be implemented at an area for the observation according to the movement mechanism. The mechanical drawing FIG. 2 shows the possibility to mount specimens in position 1 and position 2. However this invention may be designed to allow more than 2 specimens to be mounted. Even if it is designed for mounting more than 2 specimens it will function as it is explained until now and hereinafter.

Furthermore, in a preferred embodiment of the specimen holder according to the present invention, the specimen holder is characterized in that the specimen holder movement mechanism makes it possible to retract the specimen holder a controlled distance in the direction approximately along the longer side of the specimen holder, thereby providing additional locations for mounting a specimen so that a specimen may be observed. As mentioned the movement device may handle more than 2 specimens. In such case an additional standard adjustment specimen may be mounted to allow adjustment of 2 separate correction devices, or other data acquisition devices, at the same time as the actual specimen for observation is mounted. All of these in one specimen holder are then available for instant observation. or adjustment purposes.

The explanation of the movement device of the present invention follows.

That is, a specimen holder movement device according to the present invention comprises a primary specimen holder movement mechanism for driving the specimen holder approximately along the longer side of the specimen holder, a secondary specimen holder movement mechanism for driving the specimen holder approximately along the longer side of the specimen holder with no relation to the primary specimen holder movement mechanism. The microscope goniometer stage has a movement device, operating in the previously describe X-direction along the axis of the specimen holder, referred to as the primary specimen holder movement mechanism. For example, the primary specimen holder movement mechanism is made of an actuator 21, 22, and 23 of FIG. 2. The invention is a specimen holder with a movement device in the same direction as the previously described X-direction, referred to as the secondary specimen movement mechanism. For example, as the secondary specimen movement mechanism mention may be made of an actuator 6 implemented in the handle portion of the specimen holder of FIG. 2. The secondary movement mechanism does not disturb, obstruct or affect the function of the primary movement device. The primary movement device that consists of items 21, 22 and 23 also may have a position measurement device included. The secondary movement device mounted inside the holder handle, item 6, also may have a position measurement device. This may be connected to an indication system to indicate which specimen currently is selected for observation. The measurement device of the secondary movement device does not disturb or obstruct the measurement device of the primary movement device.

For example, in a preferred embodiment, an arrangement constitution of the secondary specimen holder movement mechanism does not depend on a gonio stage and a main body of the specimen holder, or is able to be installed to any one of a gonio stage or a main body of the specimen holder.

Options for adding a secondary movement mechanism (device) are available by various methods. It will be described below.

Type 1: Secondary movement mechanism built into the specimen holder. The secondary movement device may be built in the handle, item 6, of the specimen holder itself. It is able to control the position of the specimen holder itself by the tip of the pin (7), which is then connected to linear actuator. The pin (7) may push out the holder handle (6) to control the position of the above described X-direction.

Type 2: Secondary movement device located between holder and goniometer stage. The secondary movement device is located between the specimen holder handle (5) and the microscope goniometer stage entrance surface (9). By having a device, which is able to expand its width, it would be possible to fit as described above to force the specimen holder to move in the previously described X-direction Type 3: Secondary movement device built into the goniometer stage. The secondary movement device is built into the microscope goniometer stage. It could include an actuator as described previously or another type of device pushing the holder in the X-direction described before. The concept would be opposite from the one described before but the result would be the same. Therefore it is stated that the invention is not limited by the concept described in the mechanical drawing.

In a preferred embodiment, the specimen holder movement device is characterized in that a secondary specimen holder movement mechanism is mounted to the specimen holder. The secondary movement device is preferred to be located in the specimen holder handle as described as Type 1. In this way modifications to the microscope system itself can be avoided, it would be needed for type 3. Also type 1 allows greater mechanical stability than type 2.

Furthermore, in a preferred embodiment of the specimen holder movement device according to the present invention, the specimen holder movement device may include an actuator capable of linear driving, or a piezoelectric element. These two can be controlled by electric power; it is a system that allows the secondary movement device to be remotely controlled.

The actuator capable of linear-driving is generally controlled by the power for a motor incorporated in it. It is possible to vary the thickness by the addition of the electric charge to the piezoelectric element. The power for a motor in a specimen holder is usually built in the microscope system. This power may be used to control the linear actuator in the secondary movement device. Further on a superimposed voltage may be created to control the piezoelectric element.

That is, in the case that an actuator and/or the piezoelectric element etc., are used, an object to be remotely controlled is, (1) The actuator capable of linear-driving, (2) the piezoelectric element, and (3) Both the actuator capable of linear-driving and the piezoelectric element. Moreover, it is possible to use the piezoelectric element together with the actuator capable of linear-driving since the piezoelectric element is a member capable of being controlled separately. If both a linear actuator and a piezoelectric element are used for the secondary movement device they can be controlled together remotely. They may also be controlled separately as both the actuator and the piezoelectric element are both able to be controlled by just electric power. The secondary movement device may consist of a linear actuator alone or a linear actuator together with a piezoelectric element.

Moreover, the differences between an actuator capable of linear-driving and a piezoelectric element are a minimum control capability and an operation range capable of be controlling. An operation range of the actuator capable of linear-driving depends on. specifications, but is a linear movement range of several tens of millimeters. The precision, meaning the limit of minimum movement control, of the actuator is estimated to be equal to or less than around 0.01 millimeter. On the other hand, a minimum control capability of the piezoelectric element is a nano level. However, limit of an operation range capable of be controlling with use of the piezoelectric element is estimated to be around micron meters level.

Hence a combination of an actuator capable of linear driving and a piezoelectric element will allow a sufficient movement range as well as extremely fine movement control for the secondary movement mechanism (device).

Next, the effectiveness of the movement device of the present invention is explained. An important aspect of observation with an electron microscope is, corresponding to the electron beam optical axis: Alpha angle inclination and Beta angle inclination of the specimen is needed for orientation of crystalline specimens. Beta angle inclination is only possible to perform with the specimen holder itself. Existing technology allows more than one specimen to be mounted along the X-direction of the specimen holder; a simple sliding device allows selection between these. In such a mechanism, which allows a switch between specimens, it is not possible to perform Beta angle inclination.

This will now be explained in detail. To avoid disturbance of the electron optics system, included highly stable magnetic field lenses, a specimen holder should be made of non-magnetic materials. In order to achieve highest possible resolution and magnification of a TEM or STEM, a specimen holder with the mechanical strength preventing against mechanical vibrations is necessary. The microscope lens system, namely the objective lens, surrounding the area of the specimen holder has a very limited space. The physical dimension of a specimen holder may only be designed with a diameter of between 6 millimeter and 10 millimeter. Considering this, it is obvious that it is a difficult task to design a holder providing both the function of Beta angle inclination and a specimen sliding mechanism in a limited scope. Until now it has not been done.

The best way to practice the present invention is as described in mechanical drawing FIG. 2. For the specimen holder (3), inside the holder handle portion (5) a linear actuator (6) is mounted with a pin (7) pushing on the microscope goniometer stage entrance surface (9) to push back the specimen holder (3). The movement of the pin (7) may control a gap between the holder handle portion (5) and the microscope goniometer stage entrance surface (9). The force towards the center of the microscope column (15) is created by the pressure difference inside the vacuum area (12) and the atmospheric pressured area at the rear side of the specimen holder (3). The specimen holder (3) is drawn towards the center of the microscope column (15) in the previously described X-direction (14) this way. All this is done without disturbing or interfering with the goniometer stage movement device, which consists of items 21, 22 and 23. The normal specimen location (1) may be observed. And with use of the invention the new specimen location (2) can be observed. As described previously, for electron microscopes equipped with an aberration corrector device the invention can be considered to be an indispensable technology.

The present invention is designed with a device as described above for best performance and efficiency considering a Beta angle inclination device to be included. The present invention may not disturb any structure according to the existing movement mechanism, it may be done differently depending on the purpose. Therefore, the present invention is not limited for only specimen holders designed for Beta angle inclination.

Moreover, for the explanation of the present invention a specimen holder capable of Beta angle inclination is used as an example. The present invention may be applied for any type of specimen holder that may be possible to use with a goniometer stage. The present invention is not limited to an invention especially designed for specimen holders capable of Beta angle inclination.

Further explanation of the present invention follows by examples below by reference to figures. Although the use of this invention is not limited to the examples described below.

The present invention uses a linear actuator (6) for pushing back the specimen holder relative to the goniometer stage movement control acting on surface (10) of the specimen holder. The present invention may also be used with other types of goniometer stages. The type of stages may be a completely different design and made of different materials than the one used for explanation purposes. Other design and different types of devices may be used for applying a movement of the pin (7). As long as the relative position between the goniometer stages and the specimen holder can be controlled, a pushing position for the goniometer stages, a mounting position of the linear actuator (6) built in holder or a driving pin (7), is not limited. A structure, a shape, and a material of the linear actuator (6) and a driving pin (7) mentioned as an example etc., are not limited.

The invention is a specimen holder using a linear actuator (6) creating a force on pin (7) for pushing the specimen holder away from the center of the microscope column. In the specimen holder and the specimen holder movement device according to the present invention, a preferable location of the working point for pushing the goniometer stage by the driving pin (7) installed in the linear actuator (6) may be supported at 3 points divided equally at 120 degrees around the X-axis (14) of the specimen holder from a viewpoint that it has an effect of reducing a strain caused in a X-axis of the holder. However, since it is possible to attain the effect of pushing the specimen holder if there is at least one working point, the number of the working point is not limited. Moreover, the specimen holder being pushed back by the movement device of the invention will not disturb this rotation function.

Regarding use of materials in a main body of the specimen holder according to the present invention, it is not limited to any material described so far as long as it can ensure a mechanical strength itself. The specimen holder's tip should be made of non-magnetic material if necessary to avoid disturbance of magnetic field. However, for various applications it may be designed by a number of materials, for example brass, bronze, aluminum, titanium, or ceramic or similar may be used.

The present invention makes movement of the specimen holder possible in the following way. The specimen holder is drawn into a vacuum space (12) of the microscope column (15) by the force of pressure difference. A driving pin (7) is connected to the linear actuator (6) and together they can create a force to pull the specimen holder forward to out of the microscope column (6). The expansion and contraction of the driving pin (7) makes a force to push and pull the specimen holder approximately along the X-axis.

Basically, the possibility to move from specimen location position 1 to specimen location position 2 is created by having the specimen holder (3) being pushed away from the center of the optical axis (where line 13 and line 14 crosses).

In addition, high precision control of the movement performed by the invention is possible due to the high precision linear actuator (6), which creates a high precision control in and out movement of the pin (7).

In the example for explaining the invention the linear actuator (6) combined with the pin (7) is used. However, it may be replaced with a manual micrometer device with marks. The present invention is not limited for use with a linear actuator.

In the example for explaining the invention the linear actuator (6) is used. It may be used in combination with a piezoelectric element for increasing the precision further. A piezoelectric element can be attached to a top of the driving pin (7) of the linear actuator (6)

In case of use of a piezoelectric element it may be located together with the linear actuator. It may also be located together with the goniometer stage entrance surface (9). The invention is not limited for use of either locations of a piezoelectric element.

In mechanical drawing FIG. 1 as well as in mechanical drawing FIG. 2, the pin (19) together with the spring (20) pushes back the force created by linear actuator (18). This is so-called the movement in Y-direction (13) and this movement evolves around item 4. The movement device of the present invention is not affecting or relating to this Y-direction mechanism. The two movement mechanisms work independently and do not disturb the other. The present invention is intended and limited to a device having Y-direction mechanism.

INDUSTRIAL APPLICABILITY

In recent years, use of aberration correction devices has increased bringing resolution and performance of electron microscopes to a new higher level. As a result the demand for specimen preparation in general as well as the need of standardized adjustment specimens increased. The need for a clean high vacuum area around the specimen has become more critical at the same time as the need for frequently replacing the specimens (specimen replacement procedure contaminate vacuum cleanliness) increased. Also replacing specimens increase the temperature disturbance of the highly sensitive system. This results in drift of the viewing area during observation and reduced resolution performance.

Continuing the result of improved performance of TEM and STEM has increased the need of orientating specimens with Alpha angle inclination as well as Beta angle inclination also increased.

Therefore the needs for a new technology exist. A specimen holder capable of performing Beta angle inclination and at the same time also capable to hold more than one specimen is desired. Being able to perform these functions without retracting this holder from the clean and temperature stable area is highly desired. This invention covers these needs.

This invention is a specimen holder with a movement device and this movement device operates without modifications on, or disturbance of, the existing movement device of the microscope goniometer stage. The movement device is able to fit into the handle of the specimen holder itself. This invention also allows a combination with a Beta angle inclination mechanism. An aberration correction device exclusive use standardized specimen may be mounted at the same this as a specimen for investigation may be mounted. An immediate switch between these two becomes possible. After adjustments of a aberration correction device is complete immediate observation of a specimen is possible without reducing the performance at all.

What is claimed is:

1. A specimen holder comprising:
a specimen holder movement mechanism for driving the specimen holder,
wherein:
the specimen holder movement mechanism is mounted inside a holder handle of the specimen holder; and
the specimen holder movement mechanism makes it possible to move the specimen holder approximately along the longer side of the specimen holder after the specimen holder is installed into a tube for holding the specimen holder, and allows a specimen to be observed by an electron microscope.

2. A specimen holder according to claim 1, wherein the specimen holder movement mechanism makes it possible to vary an insertion depth of the specimen holder into the tube for holding the specimen holder, with no relation to another specimen holder movement mechanism set for driving the specimen holder approximately along the longer side of the specimen holder.

3. A specimen holder according to claim 1, wherein the specimen holder movement mechanism is able to perform high precision control of the specimen location along the longer side of the specimen holder.

4. A specimen holder according to claim 1, wherein the specimen holder movement mechanism is an actuator or a micrometer capable of linear driving.

5. A specimen holder according to claim 1, wherein the specimen holder movement mechanism has a piezoelectric element.

6. A specimen holder according to claim 1, wherein the specimen holder has two or more locations for mounting a specimen which is able to be observed by the specimen holder movement mechanism.

7. A specimen holder according to claim 1, wherein the specimen holder movement mechanism makes it possible to retract the specimen holder a controlled distance in the direction approximately along the longer side of the specimen holder, thereby arranging additional locations for mounting a specimen so that a specimen may be observed.

8. A specimen holder movement device comprising:
a primary specimen holder movement mechanism for driving the specimen holder approximately along the longer side of the specimen holder,
a secondary specimen holder movement mechanism mounted to inside a handle portion of the specimen holder for driving the specimen holder approximately along the longer side of the specimen holder with no relation to the primary specimen holder movement mechanism, in the case that a specimen is mounted in an observation position of an electron microscope.

9. A specimen holder movement device according to claim 8, wherein the secondary specimen holder movement mechanism has an actuator capable of linear driving, or a piezoelectric element.

10. A specimen holder movement device according to claim 9, wherein the actuator capable of linear driving and/or a piezoelectric element is remotely controlled.

* * * * *